United States Patent [19]

Hilbrandt et al.

[11] 4,444,452

[45] Apr. 24, 1984

[54] APPARATUS FOR CENTRAL ARRANGEMENT OF ELECTRICAL CONNECTOR ELEMENTS IN MOTOR VEHICLES

[75] Inventors: Martin Hilbrandt, Iserlohn; Uwe Ossenberg, Luedenscheid; Wilhelm Lüsebrink, Halver, all of Fed. Rep. of Germany

[73] Assignee: Leopold Kostal GmbH & Co. KG, Leudenscheid, Fed. Rep. of Germany

[21] Appl. No.: 319,127

[22] Filed: Nov. 9, 1981

[30] Foreign Application Priority Data

Dec. 2, 1980 [DE] Fed. Rep. of Germany ....... 3045329

[51] Int. Cl.³ .................. H01R 9/00; H01R 13/405
[52] U.S. Cl. .................... 339/176 M; 339/198 P; 339/206 P; 339/220 R
[58] Field of Search ........... 339/166 R, 166 T, 176 R, 339/176 M, 198 S, 198 P, 206 R, 206 L, 206 P, 207 R, 207 S, 209, 210 R, 210 M, 210 T, 222, 220 R, 117 R, 117 P, 184 M

[56] References Cited

U.S. PATENT DOCUMENTS

| Re. 28,710 | 2/1976 | Finkelstein | 339/117 R |
|---|---|---|---|
| 1,827,533 | 10/1931 | Martin | 339/206 R |
| 2,157,428 | 5/1939 | Obszarny | 339/206 P |
| 2,319,443 | 5/1943 | Corte | 339/210 M |
| 2,407,695 | 9/1946 | Washcoe | 339/210 M |
| 3,334,325 | 8/1967 | Conrad et al. | 339/176 M |
| 3,562,699 | 2/1971 | Branden et al. | 339/220 R |
| 3,573,717 | 4/1971 | Lightner | 339/206 R |

FOREIGN PATENT DOCUMENTS

| 1933133 | 2/1971 | Fed. Rep. of Germany ... 339/176 M |
|---|---|---|
| 454244 | 6/1968 | Switzerland ............ 339/198 S |
| 630333 | 10/1949 | United Kingdom ........ 339/184 M |
| 2042833 | 9/1980 | United Kingdom ........ 339/198 P |

OTHER PUBLICATIONS

IBM Bulletin, vol. 9, No. 9, Feb. 1967, Deturris et al., "Pressurized Electrical Contact Block Assembly".

Primary Examiner—Joseph H. McGlynn
Assistant Examiner—Gary F. Paumen
Attorney, Agent, or Firm—Robert E. Knechtel

[57] ABSTRACT

An improved connector block for vehicles including a housing having a base with integral support posts, to the free ends of which can be attached conductor plates. For each conductor plate level a number of supports posts of equal length are provided, with the support posts of different conductor plate levels having different lengths, namely, those corresponding to the chosen conductor plate level. Each conductor plate arranged at a lower level also can be passed through by the support posts of all the conductor plates lying at a higher level.

15 Claims, 3 Drawing Figures

APPARATUS FOR CENTRAL ARRANGEMENT OF ELECTRICAL CONNECTOR ELEMENTS IN MOTOR VEHICLES

BACKGROUND OF THE INVENTION

The invention relates to an apparatus for the central arrangement of electrical connector elements in motor vehicles. Such an apparatus is conventionally designated a connector block.

In the past, it was usual for such connector blocks to be constructed in such a way that the metallic conductor plates contained therein were separated electrically from one another by plastic plates or layers of plastic.

Such connector blocks, however, have a number of disadvantages. For example, in some cases the plastic coating or plastic plates become cracked, so that faultless electrical insulation is no longer assured. Such fault areas could not be localized. Furthermore, the connector blocks are heated substantially in operation with, for example, ignition current of up to 50 amperes being conducted through the connector block, so that failures due to too high a voltage drop resulted. In addition, frequent leakage currents arose, resulting from moisture developing between the layers of plastic. Such leakage currents could not be localized nor reproduced, since the leakage may or may not occur depending on weather circumstances. These and other inherent disadvantages results in a whole series of motor vehicles having had to be recalled for replacement of connector blocks. In assembling the plastic plates and conductor plates (a layered construction process), the process has the disadvantage that the tolerances of the individual plates are additive. The terminals connected with the individual conductor plates, therefore, project to varying extents out of the housing.

It is also to be noted that with prior connector blocks, the terminals were usually subsequently connected to the conductor plates. This is relatively costly, and leads to additional potential sources of failure.

SUMMARY OF THE INVENTION

On this basis, the invention undertakes the task of creating an apparatus of the kind described having exceptional functional characteristics. Disturbances of function through undesired heating due to thermal conduction between the individual conductor plates, due to mechanical destruction of the insulation layers, due to moisture (leakage currents), insofar as this involves an interaction between the individual conductor plates, are eliminated. Furthermore, manufacture within the strictest tolerances is possible.

This problem poses itself as an especially difficult one, because in a very small space, for example, eight levels of conductor plates must be arranged, while about 250 outputs in the form of terminals or sockets must be provided.

In accordance with the invention, the above as well as other unstated objects are accomplished by providing a housing which has at the base thereof a plurality of integral support posts, to the free ends of which can be attached the conductor plates for each plate level, a number of support posts of equal length are provided, with the support posts of different plate levels having different lengths, namely, those corresponding to the chosen plate level. Each plate arranged at a lower level can be passed by or through by the support posts of all the plates lying at a higher level.

The invention differs from the previously conventional technology of using plastic as a mechanically supporting and electrically insulating material, by employing air which is a known superior insulator, and by using for mechanical support support posts of insulating material, particularly plastic, integrally formed in the housing. Furthermore, these support posts are each connected mechanically to only one conductor plate, so that thermal conduction between individual conductor plates through the support plates is practically eliminated. The occurrence of leakage currents between the individual conductor plates is also virtually eliminated with this construction. Also, a fault through mechanical destruction of individual support posts is highly improbable, since sufficient support posts to hold each conductor plate will still remain.

In principle, the invention may be reduced to the idea of holding each individual conductor plate on support posts connected only with it and with the housing, and providing air as an insulating material, which formerly, in the state of the art, was felt to be impossible, since the arrangement of such a large number of conductor plates and contact points in so small a space under the high mechanical loading in the application of motor vehicles seemed possible only by means of solid, mechanically strong insulating material.

The invention for the first time indicates a way in which, despite having a lattice construction and a corresponding weight savings, a highly mechanically resistant and exceptionally electrically functional connector block may be achieved.

The attachment of the conductor plates to the support posts can be brought about by suitable means, for example, by adhesives. The apparatus according to the invention is affected by only slight manufacturing tolerances, since in each case the tolerance of only one conductor plate is significant. In consequence, the connected contact terminals extend to effectively the same level out of the housing. It is also to be noted that the conductor plates are punched from sheets of conductive material in the form of flat conductor strips.

This has the consequence that only a small weight bears on each support post, and also sufficient space is available for passage of the longer support posts past the conductor plates on lower levels. An especially advantageous further development of the invention, formerly not conventional in the design of a connector block, consists in the conductor plates having one-piece integral connector contact strips bent at right angles out of the plane of the plate.

Through this arrangement, on the one hand, an additional manufacturing task is eliminated, namely, the affixing of the contact strips to the conductor plates. On the other hand, an additional failure source is avoided, namely, the junction between the contact strip and the conductor plate.

In further development of this characteristic, the invention proposes that the connector contact strips be configured as knife contacts.

This on the one hand allows manufacture in a punching process, while on the other hand, a connection to the connector contact strip is made very easy using an appropriate terminal.

A further especially advantageous characteristic of the invention is seen to be that the support posts have on their free ends insertion guides for the correspondingly punched conductor plates.

In a further development, the invention proposes that the conductor plates at the support points of the associated support posts have holes which enable insertion of the pin-shaped insertion guides at the support post ends until the plate bears on the associated support post.

It is preferable that the insertion guides be thin posts on the support post ends, with the support posts and these pins displaying circular cross sections, but the cross sections of the pins having a smaller diameter than the support posts and the corresponding holes in the conductor plates.

It can also be advantageous for the support posts of each plate level to have a different cross sectional shape and/or dimension.

In this way, installation of individual plates in the assigned levels without exchange is assured.

This additional security is not in itself necessary, as the conductor plates must, of necessity, all have a distinct geometrical form.

For mechanical attachment of the plates to the support posts, it is especially advantageous for the support posts to have deformable ends which can be passed through the corresponding plate opening. Preferably, it is provided that these deformable ends are at the same time the insertion guides.

In assembly, the insertion guides of the support posts are extended through holes in the conductor plates, and then the insertion guides are deformed mushroom-fashion, so that a firm mechanical connection between the support post and the conductor plate results.

It is furthermore envisioned that the housing be provided with walls with a height corresponding to the highest conductor plate level including the contact strip associated with the highest conductor plate.

Furthermore, the housing can be closed with a cover.

In further development, it is envisioned that the cover be provided with retaining posts which are formed in one piece, and extend toward the base, with the retaining posts each arranged coaxially to the associated support posts, and with the lengths of the associated retaining and support posts being slightly shorter than the clear height of the housing between the base and the cover, whereby between the retaining post end and the associated support post end a small gap remains.

These retaining posts constitute an additional safeguard, insofar as the mechanical connection between the support post and the conductor plate may be lost.

A small gap is allowed to remain between the retaining post and the support post so that no unnecessarily great expense need be incurred with regard to the manufacturing tolerance.

In further development, it is envisioned that in the cover, pockets be formed for the contact strips, which are accessible from the outside through a terminal slit. Through these pockets, on the one hand, the contact strips are additionally held mechanically, and on the other hand, they constitute an insertion guide for the corresponding terminal plug.

It is additionally envisioned that the cover be snap-connected to the housing.

Thus, an especially simple connection between the cover and the housing is possible.

In further development, it is envisioned that the support posts be hollow in configuration.

It can be advantageous for connection terminals to be installed in the hollow support posts, which on the one hand are mechanically and electrically connected to the associated conductor plate, and on the other hand, extend outward to a level passing through the base to additional connection terminals.

The connection terminals may be flat or tubular.

It is especially advantageous for the housing, the side walls, and/or the cover to be provided with ventilation slits.

In this way good ventilation and heat dissipation of the connector block is possible.

The connector block furthermore substantially reduces or eliminates electrical wiring heretofore normally required. Accordingly, it is an object of the present invention to provide an improved connector block, for motor vehicles and the like.

BRIEF DESCRIPTION OF THE DRAWINGS

For a fuller understanding of the nature and objects of the invention, reference should be had to the following detailed description taken in connection with the accompanying drawings, in which.

Similar reference characters refer to similar parts throughout the several views of the drawings.

DESCRIPTION OF THE EMBODIMENT

Figure 1:
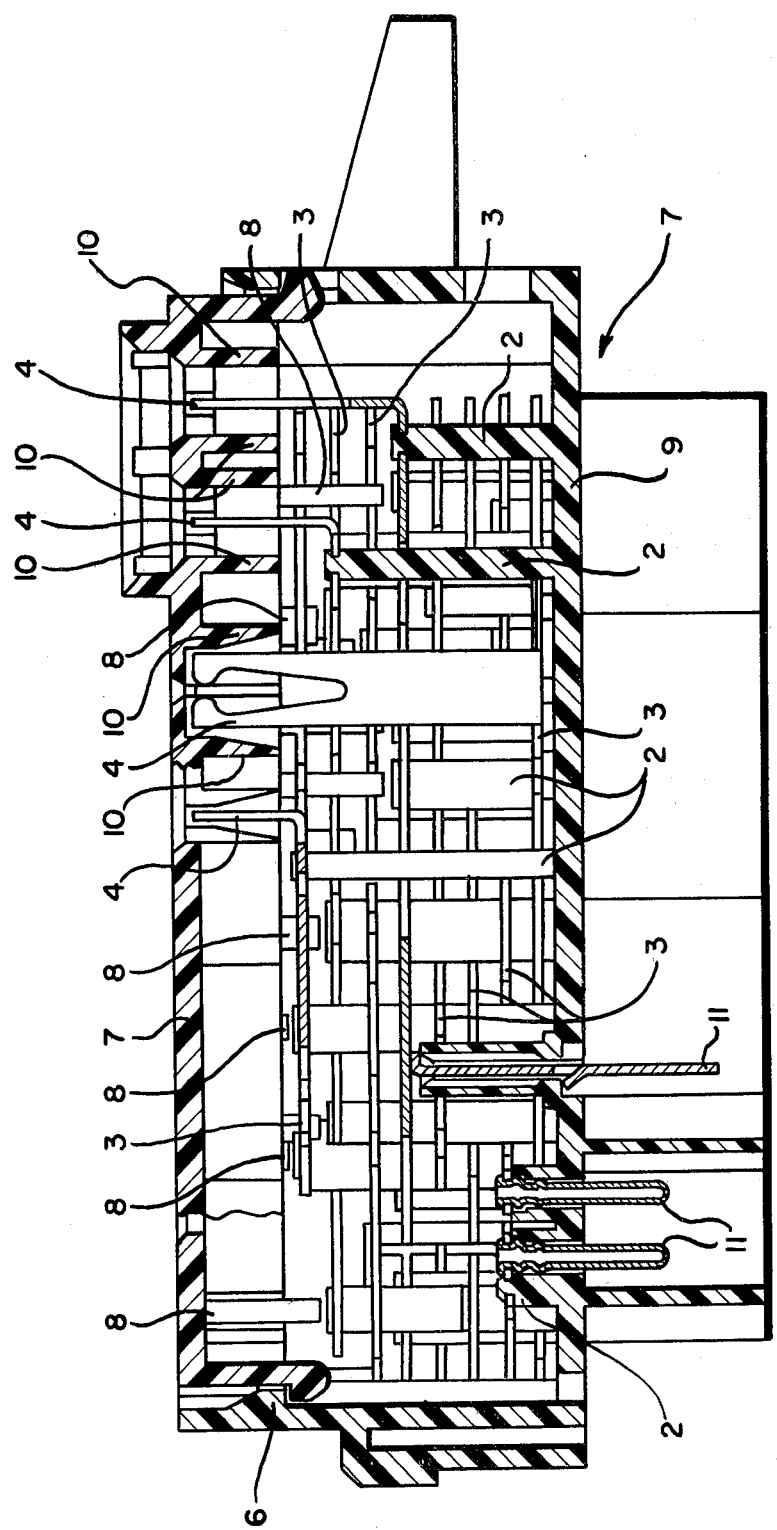
FIG. 1 is a cross-sectional view of a connector block exemplary of the invention.

The apparatus for providing a central arrangement of the electrical connector elements in motor vehicles, (connector block for short) consists of a housing 1 with walls 6, and a cover 7. The housing 1, consisting of plastic, has on its base integral support posts 2, to the free ends of which can be attached conductor plates 3. For each plate level, a number of support posts 2 of equal length are provided. The support posts 2 of different plate levels are of different length, with the lengths thereof corresponding to the associated one of the plate levels. In addition, the longer support posts 2 pass without touching by or through the conductor plates 3 supported at a lower level. In the illustrated embodiment, the conductor plates 3 are arranged in eight levels one above the other. The conductor plates 3 are each configured as a flat conductor strip. The conductor plates 3 are punched from conventional sheets of conductive material. In the punching process, simultaneously, contact strips 4 can be cut and formed on the conductor plates, and then bent in a subsequent processing step to a right angle with respect to the plane of the conductor plates. The contact strips 4, in the illustrated embodiment are configured as knife contacts.

At their free ends, the support posts 2 can have formed thereon insertion guides 5 (FIG. 2), onto which the conductor plates 3 with corresponding holes are mounted. The insertion guides 5 are circular in cross section, like the support posts 2 themselves. The insertion guides 5, relative to the associated support posts 2, are smaller in diameter, so that the conductor plate 3 with its holes can be pushed over the insertion guides 5 until the conductor plate 3 abuts against the larger diameter support post. The insertion guides 5 after installation of the conductor plate 3 are deformed like rivet heads over the conductor plate 3, so that a firm connection between the conductor plate and support post results.

The housing walls 6 are of a height such that the contact strips 4 lie within the housing 1. The housing 1 is covered with a snap-on cover 7. On the interior of the cover 7 are formed downwardly extending retaining posts 8. The retaining posts 8 are each arranged coaxially to an associated one of the support posts 2. When the cover 7 is affixed to the housing 1, a narrow gap remains between the ends of the support posts 2 and the retaining posts 8.

The cover 7 has pockets 10 for receiving therein the contact strips 4. These pockets 10 are accessible from the outside of the cover 7 through slits 15 in the cover 7, to permit connections to be made with the contact strips 4.

As can be best seen in FIG. 1, the support posts 2 also can be in part hollow, so that connector plugs 11 can be inserted in them. These connector plugs 11 are fixedly secured in the associated support post 2 by a snap connection. The connector plugs 11 are formed to mechanically and electrically connect to the conductor plate 3 associated with the support post 2. The connector plugs 11 extend outward from the base 9 of the housing 1, and are enclosed by a collar formed on the base 9.

Figure 2:
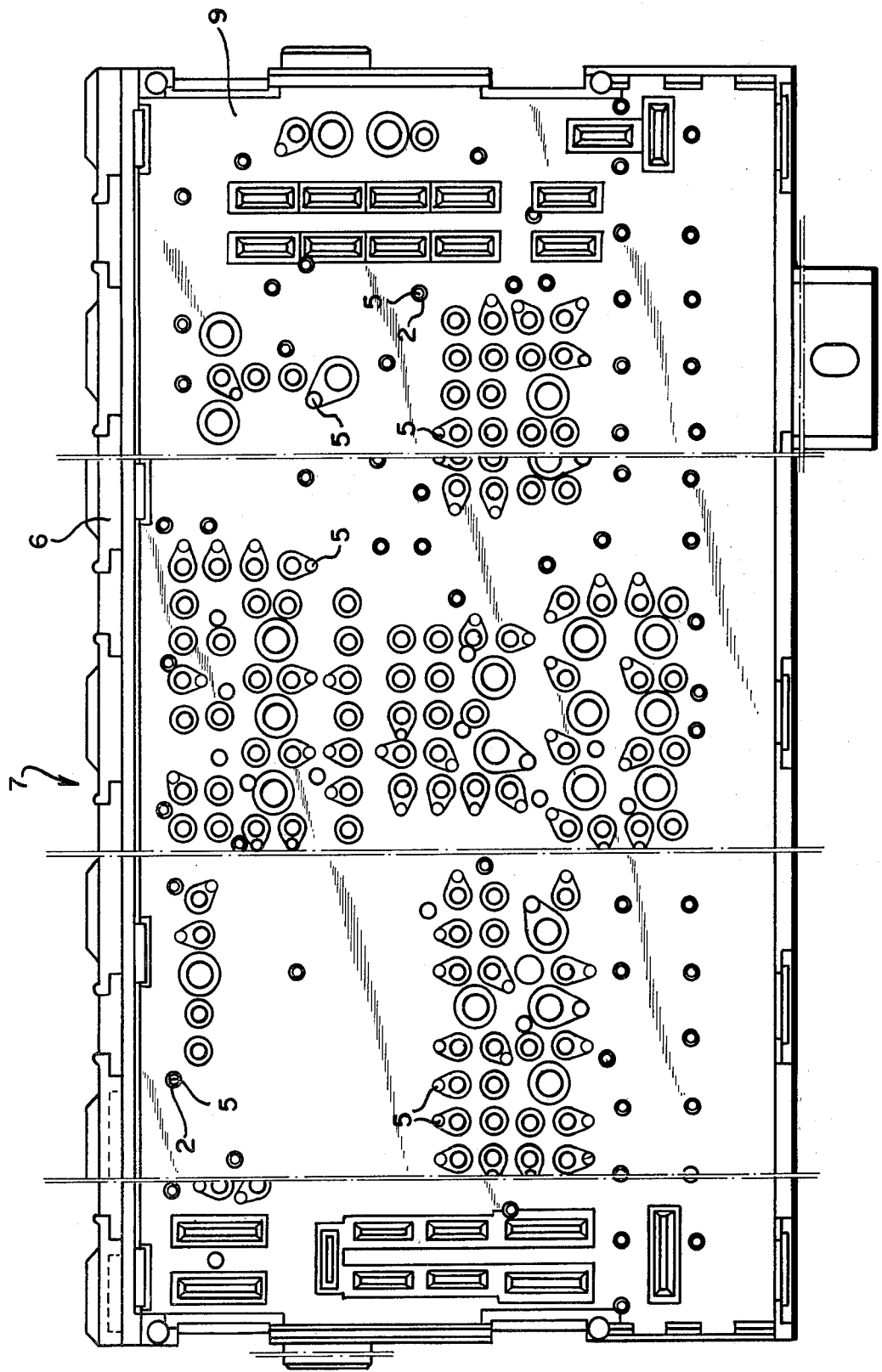
FIG. 2 is a plan view of the interior of the housing of the connector block.
Figure 3:
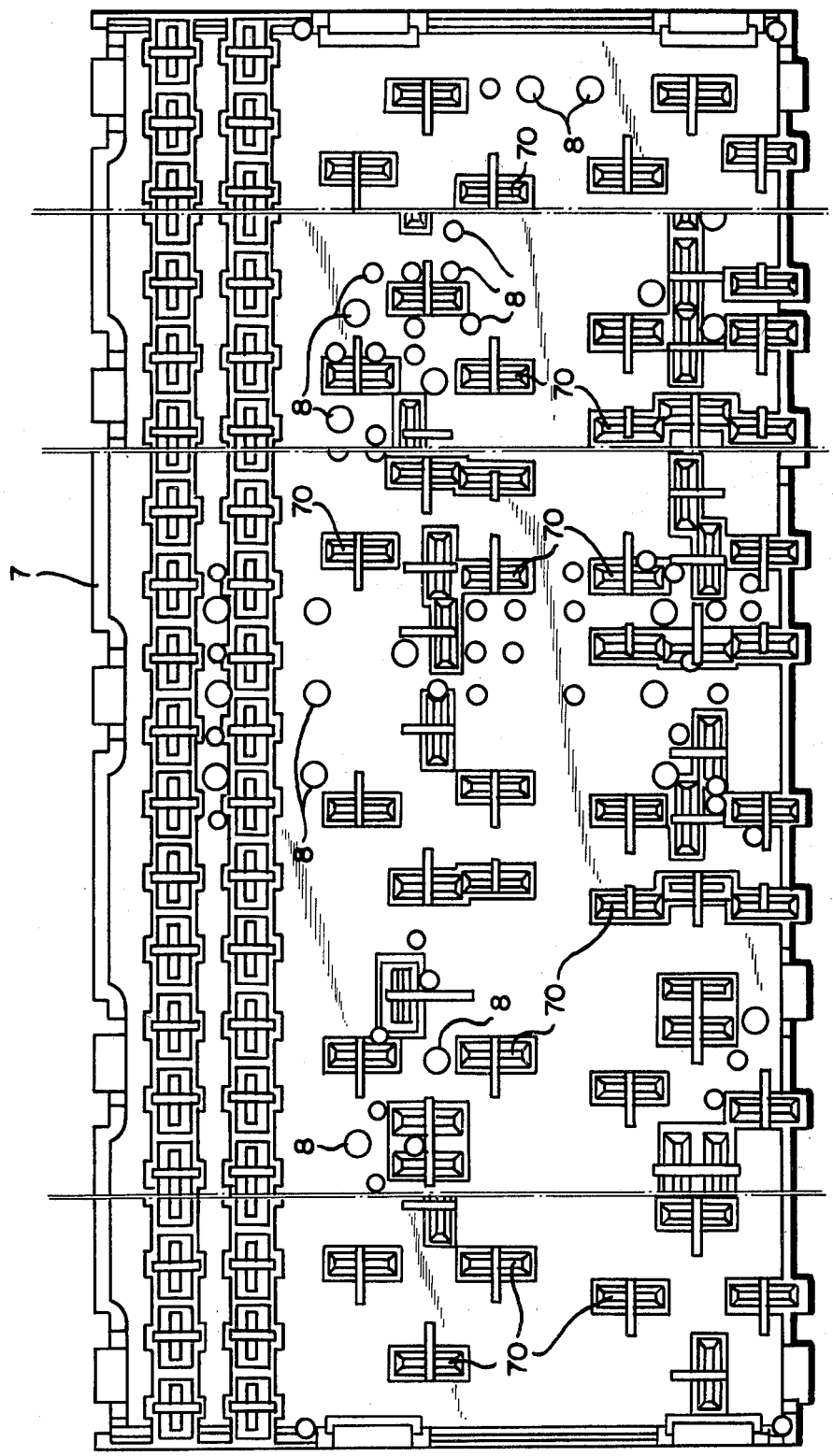
FIG. 3 is a plan view of the cover of the connector block as seen from within.

Whereas in FIG. 1 a cutaway of a completely assembled connector block is shown, FIGS. 2 and 3 represent only drawings of component parts. In FIG. 2 is seen the interior of the housing toward the base 9. A number of support posts 2 with insertion guides 5 are there visible. In addition, slits for plug terminals and receptacles for tubular plugs can be seen. FIG. 3 shows the cover of the apparatus from within. In particular, the support posts 8 and the pockets 10 for the connector plugs 11 are visible.

It will thus be seen that the objects set forth above, among those made apparent from the preceding description, are efficiently attained and certain changes may be made in the above construction. Accordingly, it is intended that all matter contained in the above description or shown in the accompanying drawings shall be interpreted as illustrative and not in a limiting sense.

Now that the invention has been described, what is claimed as new and desired to be secured by Letters Patent is:

1. A connector block for centrally mounting electrical connector elements in motor vehicles comprising a housing of an insulating material having integrally formed at its base a plurality of upwardly projecting support posts, to the free ends of which bar-shaped conductor plates are attached, said conductor plates being disposed in different spaced-apart levels and being thereby electrically insulated from one another solely by air, whereby the need for insulating material between said conductor plates to support and to electrically insulate them from one another is eliminated for each said level a number of support posts of equal lengths are provided, with the support posts of different levels having different lengths, corresponding to the level with which the support posts are associated, predetermined ones of said conductor plates placed at a lower level being passed by or through by the support posts of higher level conductor plates.

2. Apparatus according to claim 1, wherein the conductor plates are formed of flat conductor strips.

3. Apparatus according to claim 1, wherein the conductor plates are formed with integral contact strips bent up at right angles out of the plane thereof.

4. Apparatus according to claim 3, wherein the contact strips are knife contacts.

5. Apparatus according to claim 1, wherein the support posts have on their free ends insertion guides and the conductor plates have corresponding holes for receiving therethrough the insertion guides.

6. Apparatus according to claim 5, wherein the holes in the conductor plates enable insertion therethrough of the insertion guides until the conductor plate abuts against the support post.

7. Apparatus according to claim 6, wherein the insertion guides on the support post ends are integral thin posts, with the support posts and the insertion guides having circular cross sections, the cross section of said insertion guides having a smaller diameter than the support posts and the corresponding holes of the conductor plates.

8. Apparatus according to claim 1, the support posts have different cross sectional shape and/or dimension.

9. Apparatus according to claim 1, wherein the insertion guides on the support posts are deformable to affix said conductor plate to said support posts.

10. Apparatus according to claim 3, wherein the housing is provided with walls having a height corresponding to the highest level of said conductor plates including the contact strips integral therewith.

11. Apparatus according to claim 1, wherein the housing can be closed with a cover.

12. Apparatus according to claim 11, wherein the cover is provided with retaining posts extending toward the base of the housing, the retaining posts each being positioned coaxially to an associated support post and of such length that a small gap remains between the retaining posts and the support posts.

13. Apparatus according to claim 12, wherein the cover is formed with pockets for receiving therein the contact strips on the conductor strips and slits providing access to the pockets from the outside of the housing whereby contact can be established with the contact strips in the pockets.

14. Apparatus according to claim 13, wherein the cover makes a snap connection with the housing.

15. Apparatus according to claim 1, including support posts which are hollow.

* * * * *